(12) United States Patent
Lee

(10) Patent No.: US 11,145,363 B2
(45) Date of Patent: Oct. 12, 2021

(54) MEMORY DEVICE INCLUDING DISCHARGE CIRCUIT

(71) Applicant: SK hynix Inc., Icheon (KR)

(72) Inventor: Hyung Dong Lee, Suwon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/877,441

(22) Filed: May 18, 2020

(65) Prior Publication Data

US 2021/0082501 A1 Mar. 18, 2021

(30) Foreign Application Priority Data

Sep. 16, 2019 (KR) ........................ 10-2019-0113725

(51) Int. Cl.
*G11C 11/00* (2006.01)
*G11C 13/00* (2006.01)

(52) U.S. Cl.
CPC ........ *G11C 13/003* (2013.01); *G11C 2213/71* (2013.01); *G11C 2213/79* (2013.01)

(58) Field of Classification Search
CPC .............. G11C 13/003; G11C 2213/71; G11C 2213/79; G11C 11/00
USPC ........................................................ 365/148
See application file for complete search history.

(56) References Cited

U.S. PATENT DOCUMENTS

| 8,050,109 | B2 | 11/2011 | Yan et al. | |
|---|---|---|---|---|
| 8,264,867 | B2* | 9/2012 | Kawaguchi | G11C 13/0028 365/148 |
| 8,363,448 | B2* | 1/2013 | Shimotori | G11C 13/0038 365/148 |
| 2006/0285380 | A1* | 12/2006 | Cho | G11C 5/025 365/148 |
| 2011/0051498 | A1* | 3/2011 | Shimotori | G11C 13/0038 365/148 |
| 2011/0235392 | A1* | 9/2011 | Kawaguchi | G11C 8/08 365/148 |

FOREIGN PATENT DOCUMENTS

KR 20180058272 A 6/2018

* cited by examiner

*Primary Examiner* — Harry W Byrne

(57) ABSTRACT

A memory device includes: first conductive lines extending in a first direction; second conductive lines extending in a second direction intersecting the first direction; a plurality of memory cells disposed at intersection portions of the first conductive lines and the second conductive lines; first selection transistors respectively connected to the first conductive lines, the first selection transistors constituting a plurality of groups; and first discharge circuits respectively connected to the plurality of groups of first selection transistors, each of the first discharge circuits discharging a group of first conductive lines corresponding thereto among the first conductive lines in response to a gate control signal.

17 Claims, 9 Drawing Sheets

MEMORY DEVICE INCLUDING DISCHARGE CIRCUIT

CROSS-REFERENCE TO RELATED APPLICATION

The present application claims priority under 35 U.S.C. § 119(a) to Korean Patent Application Number 10-2019-0113725, filed on Sep. 16, 2019, which is incorporated herein by reference in its entirety.

BACKGROUND

Field of Invention

The present disclosure generally relates to a memory device, and more particularly, to a variable resistance memory device.

Description of Related Art

An electronic device such as a computer, a digital camera or a smart phone processes data, using a memory system. The memory system may include a memory device including a memory cell in which data is stored and a controller for controlling the memory device.

Various memory devices have been developed to satisfy the need of high performance, miniaturization, and low power consumption. A variable resistance memory device has been proposed as an example of next-generation memory devices. The variable resistance memory device may have a resistance state changed depending on a voltage or current applied to a memory cell, and maintain a resistance state stored in the memory cell without the supply of external power. Examples of the variable resistance memory device are a phase change random access memory (PRAM), a Magnetic RAM (MRAM), a Resistive RAM (RRAM), a Ferroelectric RAM (FRAM), an E-fuse, and the like.

SUMMARY

In accordance with an aspect of the present disclosure, there is provided a memory device including: a first deck including a first memory cell connected to a first deck-first conductive line; a second deck disposed over the first deck, the second deck including a second memory cell connected to a second deck-first conductive line; a third deck disposed over the second deck, the third deck including a third memory cell connected to a third deck-first conductive line; a fourth deck disposed over the third deck, the fourth deck including a fourth memory cell connected to a fourth deck-first conductive line; a first selection circuit including a first discharge circuit and first and second selection transistors respectively connected to the first deck-first conductive line and the third deck-first conductive line, the first discharge circuit commonly connected to the first and second selection transistors; and a second selection circuit including a second discharge circuit and third and fourth selection transistors respectively connected to the second deck-first conductive line and the fourth deck-first conductive line, the second discharge circuit commonly connected to the third and fourth selection transistors.

In accordance with another aspect of the present disclosure, there is provided a memory device including: a first deck including a first memory cell connected to a first deck-first conductive line extending in a first direction and a lower second conductive line extending in a second direction intersecting the first direction; a second deck disposed over the first deck, the second deck including a second memory cell connected to the lower second conductive line and a second deck-first conductive line extending in the first direction; a third deck disposed over the second deck, the third deck including a third memory cell connected to a third deck-first conductive line extending in the first direction and an upper second conductive line extending in the second direction; a fourth deck disposed over the third deck, the fourth deck including a fourth memory cell connected to the upper second conductive line and a fourth deck-first conductive line extending in the first direction; a first selection circuit configured to commonly control a discharge operation of the first deck-first conductive line and a discharge operation of the third deck-first conductive line, and individually control a selection operation of the first deck-first conductive line and a selection operation of the third deck-first conductive line; and a second selection circuit configured to commonly control a discharge operation of the second deck-first conductive line and a discharge operation of the fourth deck-first conductive line, and individually control a selection operation of the second deck-first conductive line and a selection operation of the fourth deck-first conductive line.

In accordance with still another aspect of the present disclosure, there is provided a memory device including: first conductive lines extending in a first direction; second conductive lines extending in a second direction intersecting the first direction; a plurality of memory cells disposed at intersection portions of the first conductive lines and the second conductive lines; first selection transistors respectively connected to the first conductive lines, the first selection transistors constituting a plurality of groups; and first discharge circuits respectively connected to the plurality of groups of first selection transistors, each of the first discharge circuits discharging a group of first conductive lines corresponding thereto among the first conductive lines in response to a gate control signal, wherein each of the plurality of groups of first selection transistors includes two or more of the first selection transistors.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory device capable of reducing an area occupied by a peripheral circuit.

Figure 1:
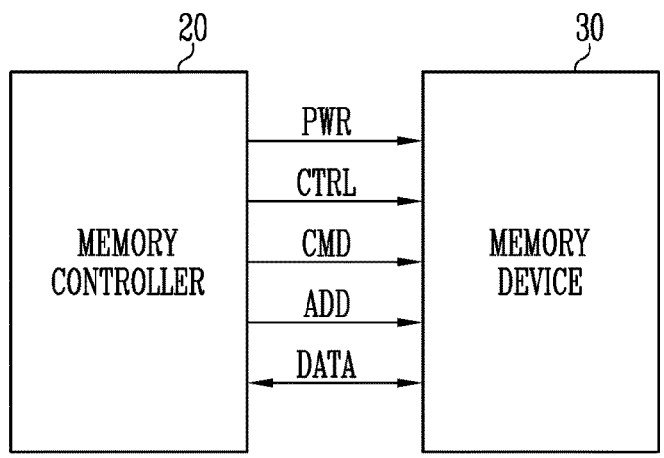
FIG. 1 illustrates a memory system in accordance with an embodiment of the present disclosure.

FIG. 1 illustrates a memory system 10 in accordance with an embodiment of the present disclosure.

Referring to FIG. 1, the memory system 10 may include a memory controller 20 and a memory device 30.

The memory controller 20 may control overall operations of the memory system 10, and control data exchange between an external device (e.g., a host) and the memory device 30. For example, the memory controller 20 may generate a command CMD and an address ADD that correspond to a request received from the host, and provide the command CMD and the address ADD to the memory device 30.

The memory device 30 may include a cross-point memory device including memory cells disposed at intersection points of conductive lines. For example, the memory device 30 may include a variable resistance memory device. Hereinafter, embodiments based on a variable resistance memory device will be described. However, the present disclosure is not limited thereto, and may be applied to various cross-point memory devices in addition to the variable resistance memory device.

The memory device 30 may perform a read operation and a write operation in response to the command CMD and the address ADD that are provided from the memory controller 20. The memory device 30 may exchange data DATA with the memory controller 20. Also, the memory device 30 may be supplied with power PWR from the memory controller 20 through a power line, and receive a control signal CTRL from the memory controller 20 through a control line.

Figure 2:
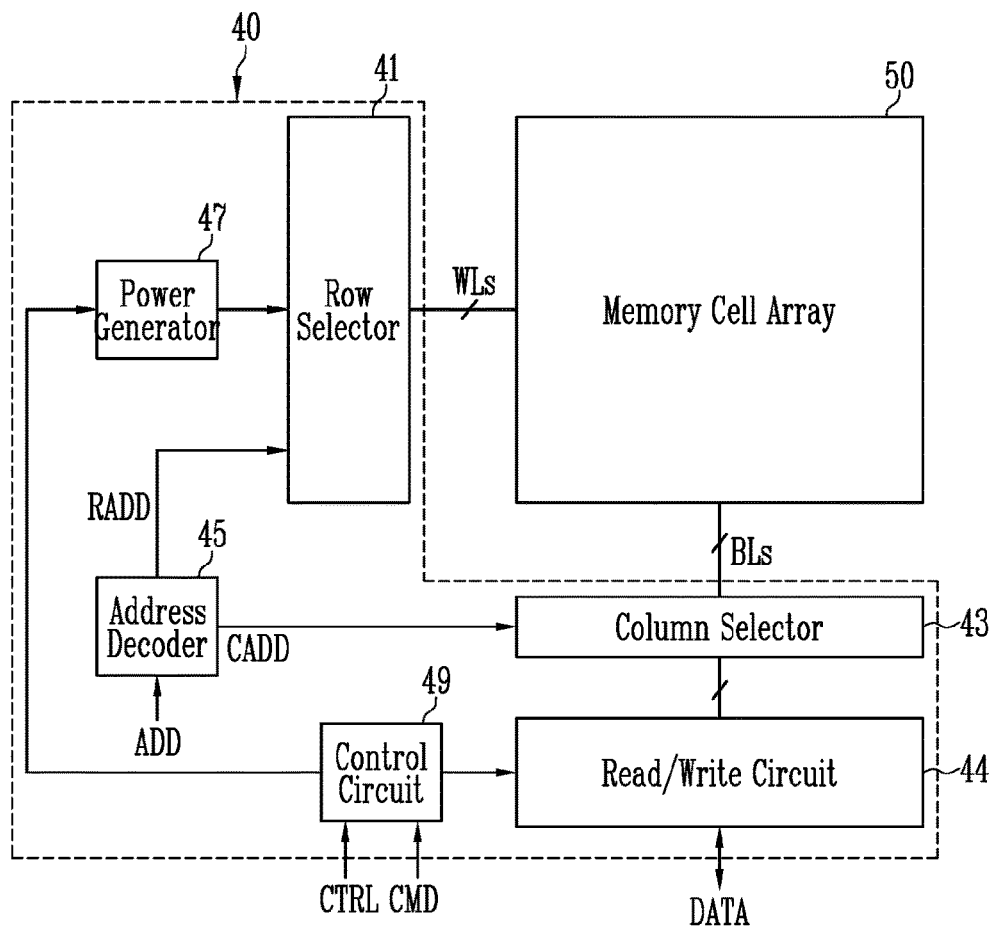
FIG. 2 illustrates a memory device in accordance with an embodiment of the present disclosure.

FIG. 2 illustrates a memory device in accordance with an embodiment of the present disclosure. The memory device shown in FIG. 2 may be used as the memory device 30 shown in FIG. 1.

Referring to FIG. 2, the memory device may include a peripheral circuit 40 and a memory cell array 50. The peripheral circuit 40 may include a row selector 41, a column selector 43, a read/write circuit 44, an address decoder 45, a power generator 47, and a control circuit 49.

The memory cell array 50 may have a cross-point structure. For example, the memory cell array 50 may include a plurality of memory cells disposed at intersection points between word lines WLs and bit lines BLs that intersect each other. The memory cell array 50 may include a three-dimensional memory cell array or a two-dimensional memory cell array.

The memory cell array 50 may be connected to the row selector 41 through the word lines WLs. The row selector 41 may be supplied with voltages or currents for various operations from the power generator 47 under the control of the control circuit 49. The row selector 41 may select one or more of the word lines WLs according to a row address RADD decoded by the address decoder 45.

The memory cell array 50 may be connected to the column selector 43 through the bit lines BLs. The column selector 43 may be supplied with voltages or currents for various operations from the read/write circuit 44 under the control of the control circuit 49. The column selector 43 may select one or more of the bit lines BLs according to a column address CADD decoded by the address decoder 45.

The read/write circuit 44 may be connected to the bit lines BLs through the column selector 43, and operate under the control of the control circuit 49. The read/write circuit 44 may record data in a memory cell connected to a bit line selected by the column selector 43. The read/write circuit 44 may read data stored in the memory cell connected to the bit line selected by the column selector 43. Data DATA read by the read/write circuit 44 may be output to the outside (e.g., the memory controller 20 shown in FIG. 1). Data DATA input to the read/write circuit 44 may be recorded in the memory cell connected to the bit line selected by the column selector 43.

The control circuit 49 may receive a control signal CTRL and a command CMD, and operate according to the received control signal CTRL and the received command CMD. The control circuit 49 may control various operations of the memory device.

The address decoder 45 may receive an address ADD. The received address ADD may include a row address RADD and a column address CADD. The address decoder 45 may transfer the row address RADD for selecting the word lines WLs to the row selector 41. The address decoder 45 may transfer the column address CADD for selecting the bit lines BLs to the column selector 43.

The peripheral circuit 40 may further include routing lines for connecting the word lines WLs to the row selector 41 and routing lines for connecting the bit lines BLs to the column selector 43.

Figure 3A:
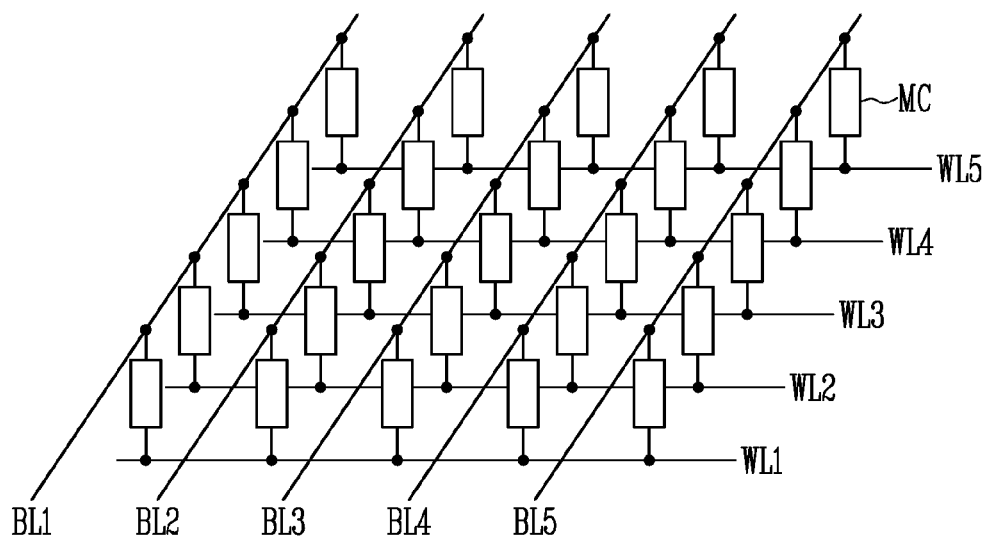
FIGS. 3A and 3B illustrate a memory cell array shown in FIG. 2 in accordance with an embodiment of the present disclosure.
Figure 3B:
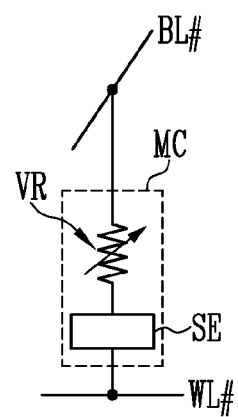

FIGS. 3A and 3B illustrate the memory cell array 50 shown in FIG. 2 according to an embodiment. FIG. 3A illustrates one cross-point array included in the memory cell array 50, and FIG. 3B illustrates a memory cell MC shown in FIG. 3A.

Referring to FIG. 3A, the memory cell array 50 may include a plurality of word lines, e.g., WL1 to WL5, and a plurality of bit lines, e.g., BL1 to BL5. The bit lines BL1 to BL5 may extends in a direction that crosses the word lines WL1 to WL5. The bit lines BL1 to BL5 may be spaced apart from the word lines WL1 to WL5 in a vertical direction. The word lines WL1 to WL5 may extend in parallel to each other, and may be spaced apart from each other on a plane intersecting the vertical direction. The bit lines BL1 to BL5 may extend in parallel to each other, and may be spaced apart from each other on a plane intersecting the vertical direction. In an embodiment, the bit lines BL1 to BL5 of the cross-point array may be arranged above the word lines WL1 to WL5 as shown in FIG. 3A in the vertical direction. In another embodiment, the bit lines BL1 to BL5 of the cross-point array may be arranged under the word lines WL1 to WL5 in the vertical direction.

Memory cells MC may be respectively disposed at intersection points of the word lines WL1 to WL5 and the bit lines BL1 to BL5. One of the word lines WL1 to WL5 is selected, and one of the bit lines BL1 to BL5 is selected, so that one of the memory cells MC coupled to the selected word line and the selected bit line can be selected. A write operation of the selected memory cell may be performed by applying corresponding voltage signals to the word lines WL1 to WL5 and the bit lines BL1 to BL5. Data stored in the memory cells MC may be read through the bit lines BL1 to BL5.

The memory cell array 50 may include a three-dimensional memory cell array or a two-dimensional memory cell array. The three-dimensional memory cell array may include a plurality of decks stacked in the vertical direction. Each of the decks may include the cross-point array shown in FIG. 3A. The two-dimensional memory cell array may include a single memory cell array such as the cross-point array shown in FIG. 3A.

Referring to FIG. 3B, each of the memory cells MC may be disposed between a word line WL # corresponding thereto and a bit line BL # corresponding thereto. The memory cell MC may include a selection element SE and a variable resistance element VR that are connected in series.

The selection element SE may be electrically connected to the word line WL #, and the variable resistance element VR may be electrically connected to the bit line BL #.

The selection element SE may control the flow of current according to the magnitude of a voltage or current applied thereto. The selection element SE may be implemented with one of various elements such as a MOS transistor, a PN diode, an Ovonic Threshold Switching (OTS) element, and so on.

The variable resistance element VR may include a variable resistance layer having a resistance state that can be changed depending on a voltage or current applied thereto. The variable resistance element VR may be implemented with a variable resistance element of a Phase change Random Access Memory (PRAM), a Magnetic RAM (MRAM), a Resistive RAM (RRAM), a Ferroelectric RAM (FRAM), or the like. For example, the resistance state of the variable resistance element VR may be changed to a high resistance state or a low resistance state by a voltage applied to the word line WL # and the bit line BL #. A write operation for changing the high resistance state to the low resistance state may be defined as a set operation, and a write operation for changing the low resistance state to the high resistance state may be defined as a reset operation.

Figure 4:
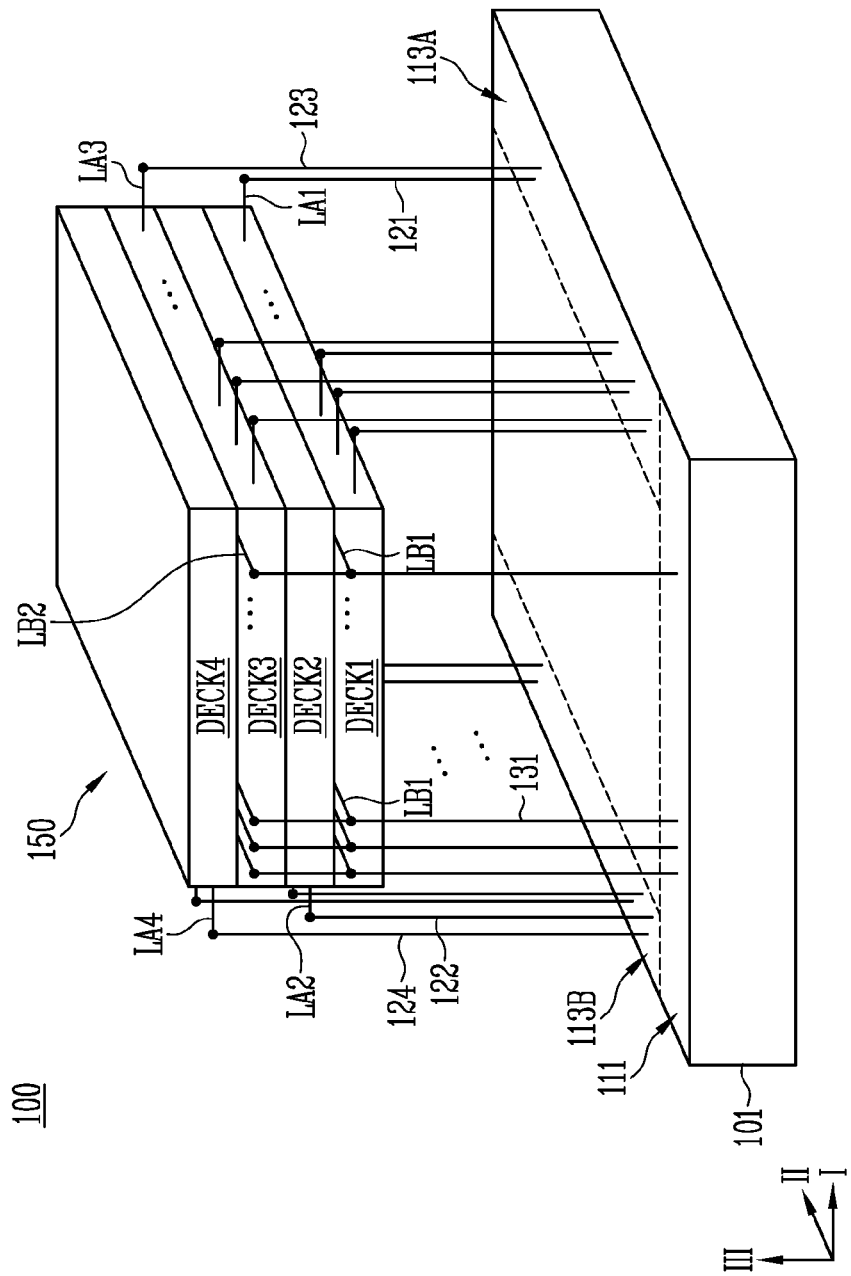
FIG. 4 illustrates a memory device in accordance with an embodiment of the present disclosure.

FIG. 4 illustrates a memory device 100 in accordance with an embodiment of the present disclosure. FIG. 4 illustrates the memory device 100 including a three-dimensional memory cell array 150.

The memory device 100 shown in FIG. 4 may be used as the memory device 30 shown in FIG. 1 or be used as the memory device shown in FIG. 2. The three-dimensional memory cell array 150 of the memory device 100 shown in FIG. 4 may include the cross-point array and the memory cell, which are described with reference to FIGS. 3A and 3B.

Referring to FIG. 4, the memory device 100 may implement the three-dimensional memory cell array 150 with two or more decks stacked in a vertical direction III on a substrate 101. For example, the three-dimensional memory cell array 150 may include first to fourth decks DECK1 to DECK4 stacked in the vertical direction III. The vertical direction III may be defined as a direction perpendicularly intersecting a plane extending in a first direction I and a second direction II and be perpendicular to a surface of the substrate 101.

The substrate 101 may include circuits constituting the peripheral circuit 40 described with reference to FIG. 2. For example, the substrate 101 may include selectors 111, 113A, and 113B. At least one of the selectors 111, 113A, and 113B may constitute the column selector 43 described with reference to FIG. 2, and the other of the selectors 111, 113A, and 113B may constitute the row selector 41 described with reference to FIG. 2.

The first to fourth decks DECK1 to DECK4 may include first conductive lines LA1 to LA4 extending in the first direction I and second conductive lines LB1 and LB2 extending in the second direction II. The second deck DECK2 may be disposed on the first deck DECK1, the third deck DECK3 may be disposed on the second deck DECK2, and the fourth deck DECK4 may be disposed on the third deck DECK3.

The first conductive lines LA1 to LA4 may be spaced apart from each other in the second direction II and the vertical direction III. For example, the first conductive lines LA1 to LA4 may include first deck-first conductive lines LA1 connected to the first deck DECK1, second deck-first conductive lines LA2 connected to the second deck DECK2, third deck-first conductive lines LA3 connected to the third deck DECK3, and fourth deck-first conductive lines LA4 connected to the fourth deck DECK4. The first deck-first conductive lines LA1 may be arranged to be spaced apart from each other in the second direction II. The second deck-first conductive lines LA2 may be arranged to be spaced apart from each other in the second direction II. The third deck-first conductive lines LA3 may be arranged to be spaced apart from each other in the second direction II. The fourth deck-first conductive lines LA4 may be arranged to be spaced apart from each other in the second direction II. In the vertical direction III, the second deck-first conductive lines LA2 may be disposed above the first deck-first conductive lines LA1, the third deck-first conductive lines LA3 may be disposed above the second deck-first conductive lines LA2, and the fourth deck-first conductive lines LA4 may be disposed above the third deck-first conductive lines LA3.

The second conductive lines LB1 and LB2 may be spaced apart from each other in the first direction I and the vertical direction III. For example, the second conductive lines LB1 and LB2 may include lower second conductive lines LB1 shared by the first deck DECK1 and the second deck DECK2 and upper second conductive lines LB2 shared by the third deck DECK3 and the fourth deck DECK4. The lower second conductive lines LB1 may be arranged to be spaced apart from each other in the first direction I. The lower second conductive lines LB1 may be disposed between the first deck-first conductive lines LA1 and the second deck-first conductive lines LA2, which are adjacent to each other in the vertical direction III. The upper second conductive lines LB2 may be arranged to be spaced apart from each other in the first direction I. The upper second conductive lines LB2 may be disposed between the third deck-first conductive lines LA3 and the fourth deck-first conductive lines LA4, which are adjacent to each other in the vertical direction III.

The selectors 111, 113A, and 113B may include a first conductive line selector 113A and 113B configured to select the first conductive lines LA1 to LA4 and a second conductive line selector 111 configured to select the second conductive lines LB1 and LB2. The first conductive line selector 113A and 113B may include the first selector 113A and the second selector 113B that overlap both sides of the three-dimensional memory cell array 150. A portion of the three-dimensional memory cell array 150 may overlap with the second conductive line selector 111.

As described above, the three-dimensional memory cell array 150 overlaps with the substrate 101 including the selectors 113A, 113B, and 111, so that the memory device 100 can be highly integrated within a limited area of the substrate 101.

The first selector 113A and the second selector 113B may be connected to the first to fourth decks DECK1 to DECK4 through first to fourth vertical connection structures 121, 122, 123, and 124 that are formed of a conductive material. For example, the first selector 113A may be electrically connected to the first deck-first conductive lines LA1 and the third deck-first conductive lines LA3, and the second selector 113B may be electrically connected to the second deck-first conductive lines LA2 and the fourth deck-first conductive lines LA4. The first selector 113A may be connected to the first deck-first conductive lines LA1 through the first vertical connection structures 121. The second selector 113B may be connected to the second deck-first conductive lines LA2 through the second vertical connection structures 122. The first selector 113A may be connected to the third deck-first conductive lines LA3 through the third vertical connection structures 123. The second selector 113B may be connected to the fourth deck-first conductive lines LA4 through the fourth vertical connection structures 124.

The second conductive line selector 111 may be electrically connected to the second conductive lines LB1 and LB2 through fifth vertical connection structures 131 formed of a conductive material. Each of the fifth vertical connection structures 131 may be commonly connected to a pair of a lower second conductive line LB1 and an upper second conductive line LB2 that correspond thereto.

In an embodiment, the first conductive lines LA1 to LA4 may be used as word lines, and the second conductive lines LB1 and LB2 may be used as bit lines. In another embodiment, the first conductive lines LA1 to LA4 may be used as bit lines, and the second conductive lines LB1 and LB2 may be used as word lines.

In an embodiment, the first selector 113A and the second selector 113B may be included in the row selector 41 described with reference to FIG. 2, and the second conductive line selector 111 may be included in the column selector 43 described with reference to FIG. 2. In another embodiment, the first selector 113A and the second selector 113B may be included in the column selector 43 described with reference to FIG. 2, and the second conductive line selector 111 may be included in the row selector 41 described with reference to FIG. 2.

Figure 5:
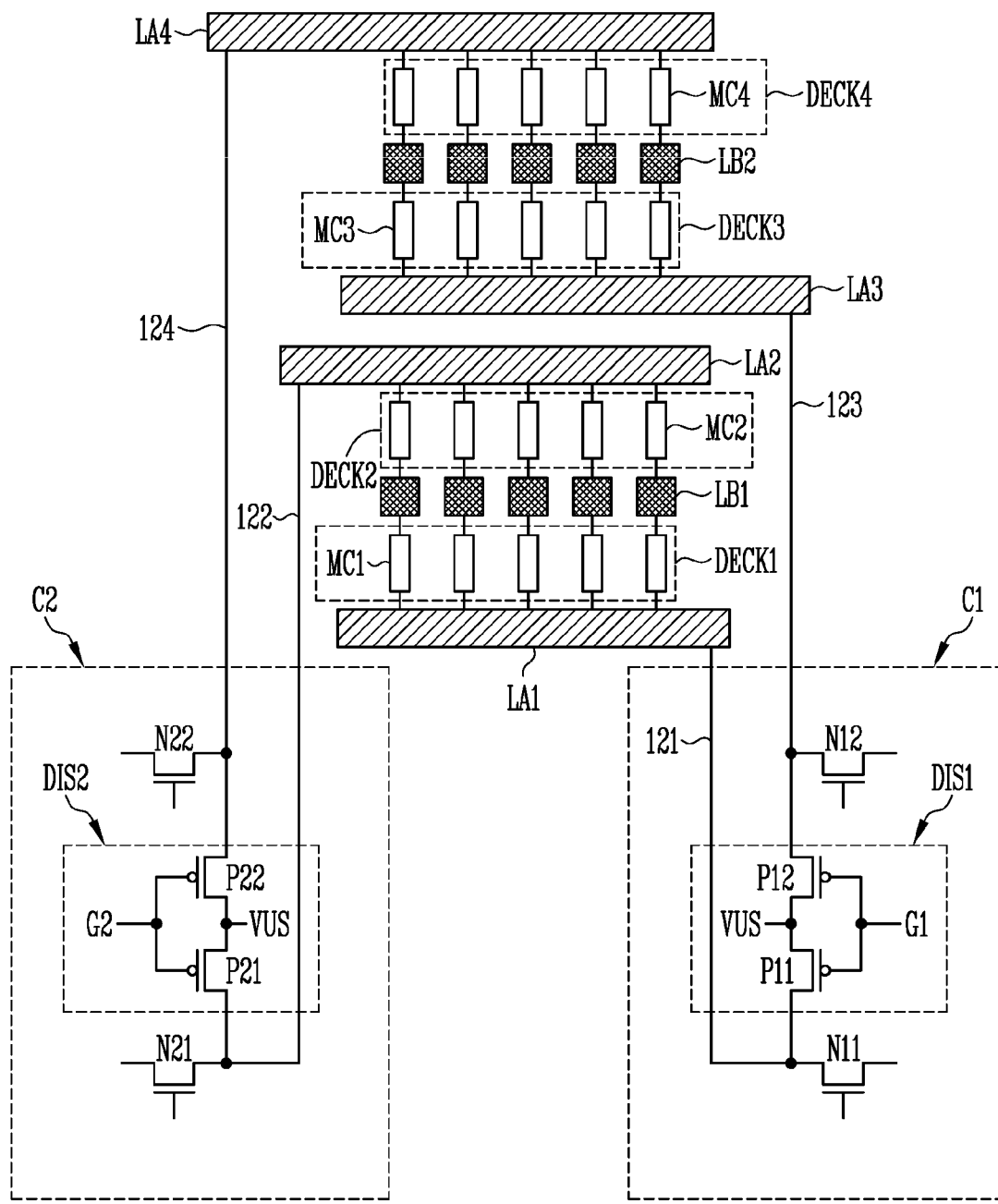
FIG. 5 illustrates first and second selectors shown in FIG. 4 in accordance with an embodiment of the present disclosure.

FIG. 5 illustrates the first and second selectors 113A and 113B shown in FIG. 4 according to an embodiment.

Referring to FIG. 5, the three-dimensional memory cell array 150 shown in FIG. 4 may include first memory cells MC1 constituting the first deck DECK1, second memory cells MC2 constituting the second deck DECK2, third memory cells MC3 constituting the third deck DECK3, and fourth memory cells MC4 constituting the fourth deck DECK4. The first memory cells MC1 may be connected to a first deck-first conductive line LA1 and lower second conductive lines LB1, the second memory cells MC2 may be connected to a second deck-first conductive line LA2 and the lower second conductive lines LB1, the third memory cells MC3 may be connected to a third deck-first conductive line LA3 and upper second conductive lines LB2, and the fourth memory cells MC4 may be connected to a fourth deck-first conductive line LA4 and the upper second conductive lines LB2. That is, the lower second conductive lines LB1 are shared by the first memory cells MC1 and the second memory cells MC2, and the upper second conductive lines LB2 are shared by the third memory cells MC3 and the fourth memory cells MC4.

Referring to FIG. 5, the first selector 113A shown in FIG. 4 may include a first selection circuit C1, and the second selector 113B shown in FIG. 4 may include a second selection circuit C2. Each of the first selection circuit C1 and the second selection circuit C2 may be shared by two or more first conductive lines. Hereinafter, an embodiment in which each of the first selection circuit C1 and the second selection circuit C2 is shared by two first conductive lines corresponding thereto will be described, but the present disclosure is not limited thereto.

In an embodiment, each of the first selection circuit C1 and the second selection circuit C2 may be shared by a pair of first conductive lines corresponding thereto. For example, the first selection circuit C1 may be shared by a pair of a first deck-first conductive line LA1 and a third deck-first conductive line LA3, and the second selection circuit C2 may be shared by a pair of a second deck-first conductive line LA2 and a fourth deck-first conductive line LA4.

Each of the first selection circuit C1 and the second selection circuit C2 may include a discharge circuit for commonly controlling discharge operations of a pair of first conductive lines connected thereto and selection transistors for individually controlling selection operations of the first conductive lines in the pair. In an embodiment, the first selection circuit C1 may include a first discharge circuit DIS1 and first and second selection transistors N11 and N12, and the second selection transistor C2 may include a second discharge circuit DIS2 and third and fourth selection transistors N21 and N22.

The first discharge circuit DIS1 may be configured to commonly control a discharge operation of the first deck-first conductive line LA1 and a discharge operation of the third deck-first conductive line LA3. The first discharge circuit DIS1 may be connected between the first selection transistor N11 and the second selection transistor N12. The first discharge circuit DIS1 may apply a non-selection voltage VUS to the first deck-first conductive line LA1 and the third deck-first conductive line LA3 in response to a first gate control signal G1. To this end, the first discharge circuit DIS1 may include a first discharge transistor P11 and a second discharge transistor P12 that share a gate with each other and share a source with each other. When the non-selection voltage VUS is applied to the first deck-first conductive line LA1 and the third deck-first conductive line LA3 through the first discharge transistor P11 and the second discharge transistor P12, respectively, the first deck-first conductive line LA1 and the third deck-first conductive line LA3 may be discharged.

A drain of the first selection transistor N11 and a drain of the first discharge transistor P11 may be connected to the first deck-first conductive line LA1 through a first vertical connection structure 121. A drain of the second selection transistor N12 and a drain of the second discharge transistor P12 may be connected to the third deck-first conductive line LA3 through a third vertical connection structure 123.

The second discharge circuit DIS2 may be configured to commonly control a discharge operation of the second deck-first conductive line LA2 and a discharge operation of the fourth deck-first conductive line LA4. The second discharge circuit DIS2 may be connected between the third selection transistor N21 and the fourth selection transistor N22. The second discharge circuit DIS2 may apply the non-selection voltage VUS to the second deck-first conductive line LA2 and the fourth deck-first conductive line LA4 in response to a second gate control signal G2. To this end, the second discharge circuit DIS2 may include a third discharge transistor P21 and a fourth discharge transistor P22 that share a gate with each other and share a source with each other. When the non-selection voltage VUS is applied to the second deck-first conductive line LA2 and the fourth deck-first conductive line LA4 through the third discharge transistor P21 and the fourth discharge transistor P22, respectively, the second deck-first conductive line LA2 and the fourth deck-first conductive line LA4 may be discharged.

A drain of the third selection transistor N21 and a drain of the third discharge transistor P21 may be connected to the second deck-first conductive line LA2 through a second vertical connection structure 122. A drain of the fourth selection transistor N22 and a drain of the fourth discharge transistor P22 may be connected to the fourth deck-first conductive line LA4 through a fourth vertical connection structure 124.

Each of the first to fourth selection transistors N11, N12, N21, and N22 and the first to fourth discharge transistors P11, P12, P21, and P22 may be implemented as an NMOS transistor or a PMOS transistor. For example, each of the first to fourth selection transistors N11, N12, N21, and N22 may be implemented as an NMOS transistor, and each of the first to fourth discharge transistors P11, P12, P21, and P22 may be implemented as a PMOS transistor. However, the present disclosure is not limited thereto.

FIG. 5 illustrates a case where the odd-numbered first conductive lines LA1 and LA3 among the first conductive lines LA1 to LA4 stacked in the vertical direction III share a discharge circuit and the even-numbered first conductive lines LA2 and LA4 among the first conductive lines LA1 to LA4 share a discharge circuit, but the present disclosure is not limited thereto. For example, in another embodiment, an odd-numbered first conductive line and an even-numbered first conductive line among the first conductive lines LA1 to LA4 stacked in the vertical direction III may share a discharge circuit.

Figure 6:
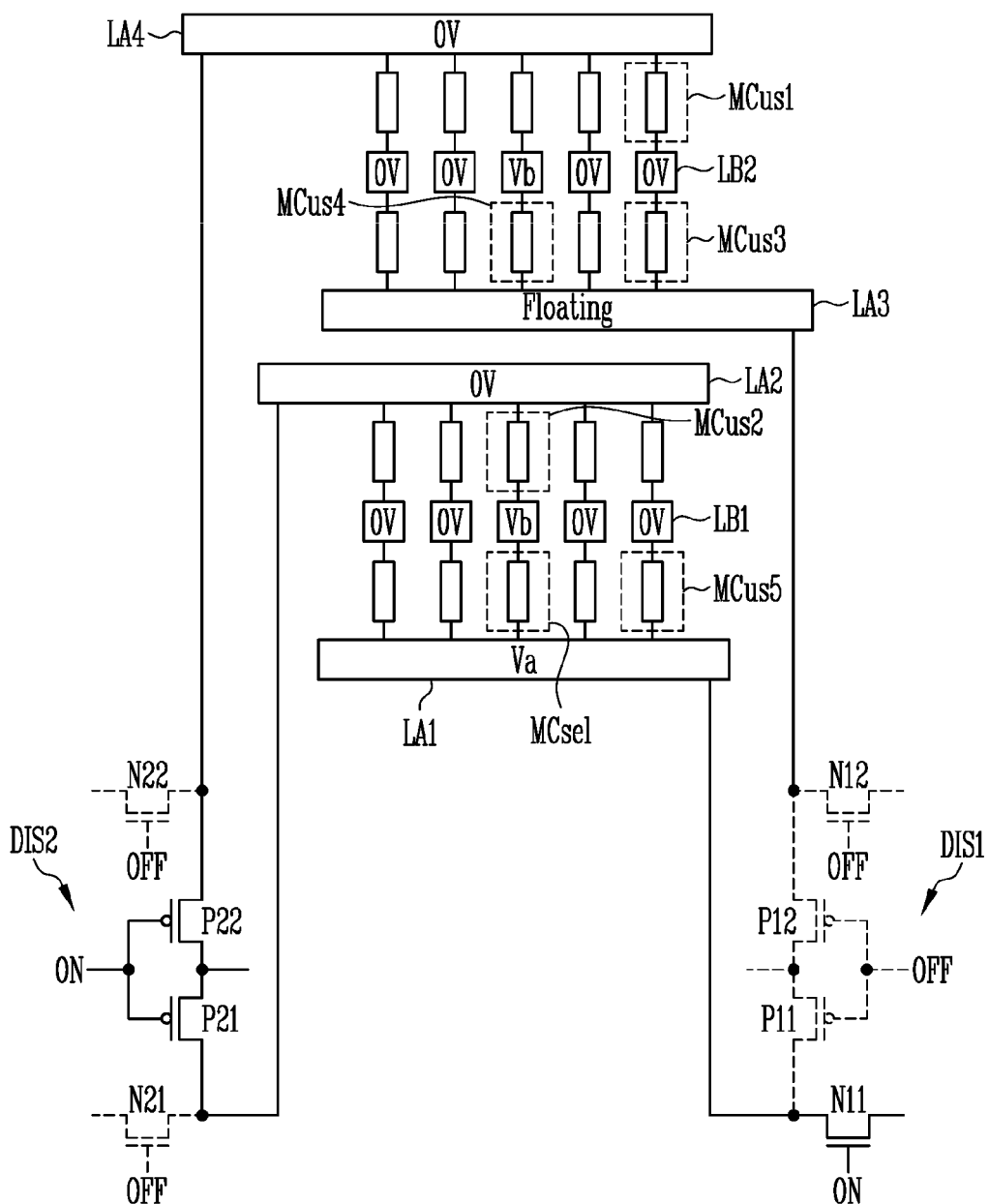
FIG. 6 illustrates a selection operation and a discharge operation of the memory device shown in FIG. 5 in accordance with an embodiment of the present disclosure.

FIG. 6 illustrates a selection operation and a discharge operation of the memory device shown in FIG. 5 according to an embodiment.

The non-selection voltage VUS described with reference to FIG. 5 may be a voltage for discharging the first conductive lines LA1 to LA4. Hereinafter, a case where 0 V is applied as the non-selection voltage VUS will be described as an example. It is assumed that the first conductive line LA1 is selected from among the first conductive lines LA1 to LA4.

The memory cells MC1 to MC4 of the memory device may include a selected cell MCsel and first to fifth unselected cells MCus1 to MCus5 in relation to operations of the first conductive lines LA1 to LA4 and operations of the second conductive lines LB1 and LB2. The selected cell MCsel may be defined as a memory cell connected to the selected first deck-first conductive line LA1 and a selected second conductive line. The first unselected cell MCus1 may be defined as a memory cell connected to the unselected first conductive line LA4 applied with a voltage of 0V from the second discharge circuit DIS2 and an unselected second conductive line. The second unselected cell MCus2 may be defined as a memory cell connected to the unselected first conductive line LA2 applied with the voltage of 0V from the second discharge circuit DIS2 and the selected second conductive line to which the selected cell MCsel is connected. The third unselected cell MCus3 may be defined as a memory cell connected to the unselected first conductive line LA3 floated from the first discharge circuit DIS1 and the unselected second conductive line to which the first unselected cell MCus1 is connected. The fourth unselected cell MCus4 may be defined as a memory cell connected to the unselected first conductive line LA3 floated from the first discharge circuit DIS1 and a selected second conductive line. The fifth unselected cell MCus5 may be defined as a memory cell connected to the selected first conductive line LA1 and an unselected second conductive line.

As described above, FIG. 6 illustrates a case where the first deck-first conductive line LA1 among the first conductive lines LA1 to LA4 is selected, and the second deck-first conductive line LA2, the third deck-first conductive line LA3, and the fourth deck-first conductive line LA4 are unselected. Also, FIG. 6 illustrates a case where one pair among lower second conductive lines LB1 and upper second conductive lines LB2, which constitute a plurality of pairs, is selected, and the other pairs are unselected.

The first deck-first conductive line LA1 may be selected by turning on the first selection transistor N11 and thus be applied with a first selection voltage Va. At this time, the second deck-first conductive line LA2, the third deck-first conductive line LA3, and the fourth deck-first conductive line LA4 may be unselected by turning off the second to fourth selection transistors N12, N21, and N22.

The unselected second deck-first conductive line LA2 and the unselected fourth deck-first conductive line LA4 may be discharged to 0V by the second discharge circuit DIS2 that is activated and distinguished from the first discharge circuit DIS1. Since the third and fourth discharge transistors P21 and P22 of the second discharge circuit DIS2 share the gate and the source, the third and fourth discharge transistors P21 and P22 may be simultaneously turned on to transmit the voltage of 0V to the unselected second deck-first conductive line LA2 and the unselected fourth deck-first conductive line LA4.

The unselected third deck-first conductive line LA3 sharing the first discharge circuit DIS1 with the selected first deck-first conductive line LA1 may be floated from a source of the first discharge circuit DIS1 that is turned off.

A second selection voltage Vb may be applied to a pair of a selected lower second conductive line LB1 and a selected upper second conductive line LB2, and a voltage of 0V may be applied to pairs of unselected lower second conductive lines LB1 and unselected upper second conductive lines LB2.

Each of the first selection voltage Va and the second selection voltage Vb may be set to be lower than a threshold voltage of each of the memory cells. One of the first selection voltage Va and the second selection voltage Vb may be set to a positive level, and the other of the first selection voltage Va and the second selection voltage Vb may be set to a negative level. A write operation may be performed on the selected cell MCsel by a voltage difference between the first selection voltage Va and the second selection voltage Vb that are applied to the selected cell MCsel. To this end, the voltage difference between the first selection voltage Va and the second selection voltage Vb may be higher than the threshold voltage of each of the memory cells.

The unselected third deck-first conductive line LA3 may be floated by turning off the first discharge circuit DIS1 and the second selection transistor N12. Since the unselected third deck-first conductive line LA3 was previously discharged to 0V and the second select voltage Vb lower than the threshold voltage is applied to the fourth unselected cell MCus4 connected to the floated third deck-first conductive line LA3, selection of the fourth unselected cell MCus4 may be inhibited even though the second selection voltage Vb is applied to the fourth unselected cell MCus4.

An unselected first conductive line in a floating state may be discharged before an operation for selecting another memory cell is performed. The unselected first conductive line in the floating state may be shielded from a selected first conductive line by the unselected first conductive line applied with 0V or an insulating layer disposed between the unselected first conductive line in the floating state and the selected first conductive line.

As described above, two or more first conductive lines, which can be individually controlled by different selection transistors, share one discharge circuit. Thus, the number of routing lines of the peripheral circuit can be decreased, and the area occupied by the peripheral circuit can be reduced.

Figure 7A:
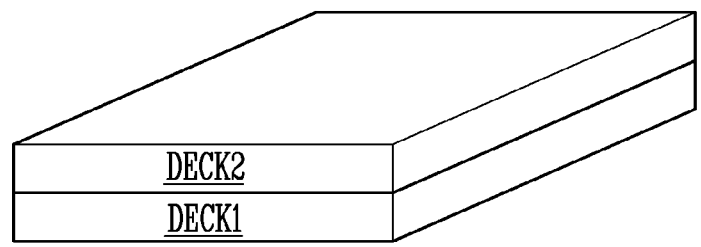
FIGS. 7A and 7B illustrate three-dimensional memory cell arrays in accordance with various embodiments of the present disclosure.
Figure 7B:
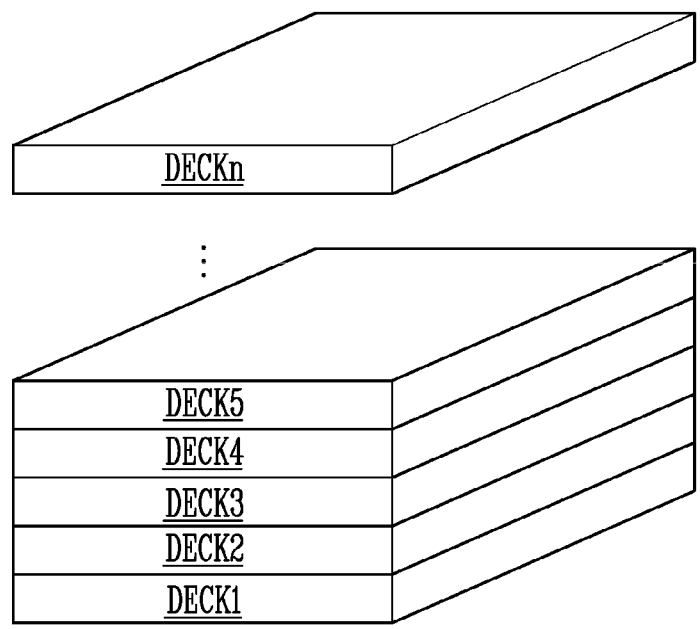

FIGS. 7A and 7B illustrate three-dimensional memory cell arrays according to various embodiments.

Referring to FIGS. 7A and 7B, the three-dimensional memory cell arrays may be implemented to have various multi-deck structures including two or more layered decks in addition to the 4-deck structure shown in FIG. 4. For example, as shown in FIG. 7A, the three-dimensional memory cell array may be implemented with a first deck DECK1 and a second deck DECK2 that are arranged in a vertical direction. Alternatively, as shown in FIG. 7B, the three-dimensional memory cell array may be implemented with five or more layered decks DECK1 to DECKn that are arranged in the vertical direction, n being equal to or larger than 5.

Figure 8:
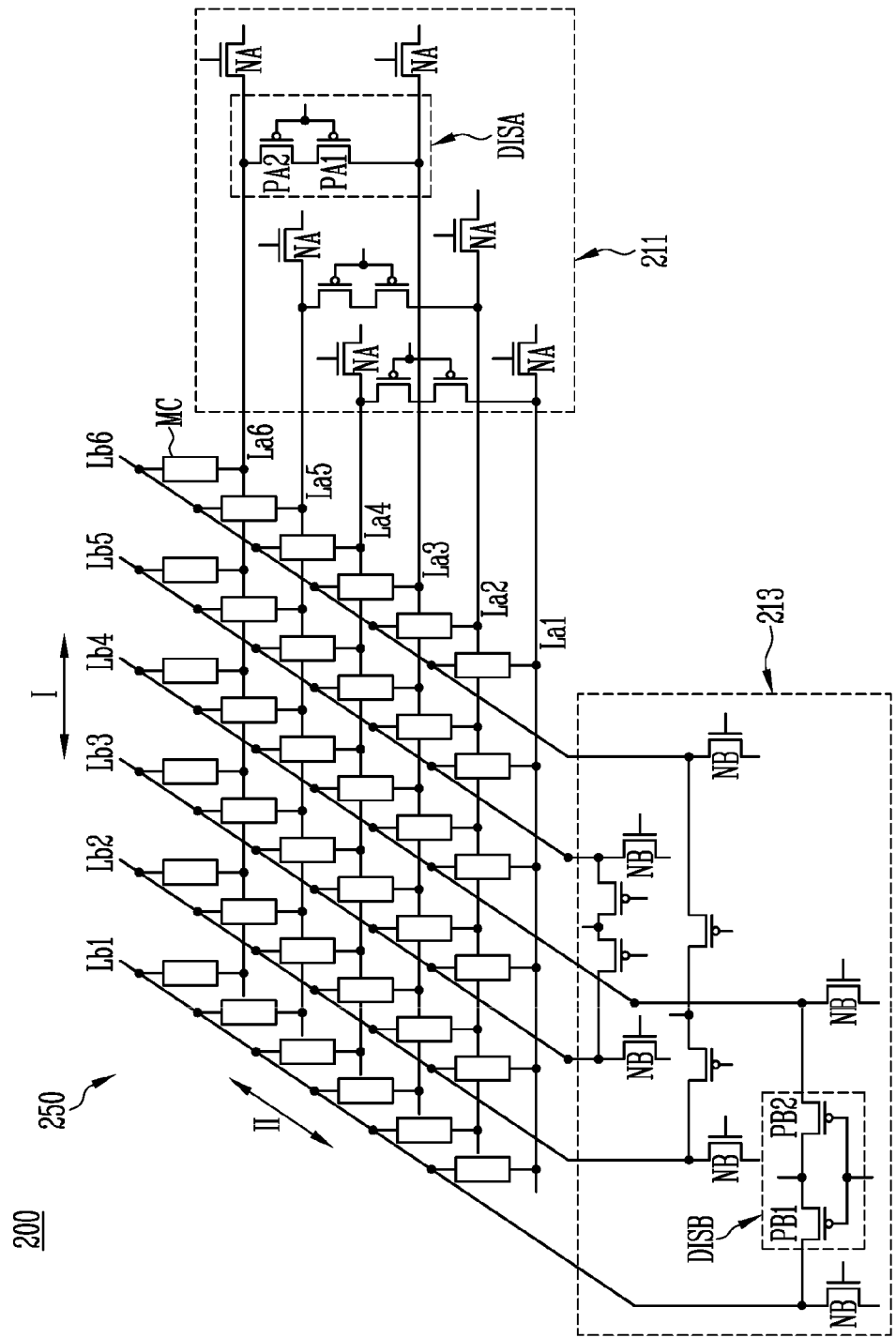
FIG. 8 illustrates a memory device including a two-dimensional memory cell array in accordance with an embodiment of the present disclosure.

FIG. 8 illustrates a memory device 200 including a two-dimensional memory cell array 250 according to an embodiment.

The memory device 200 shown in FIG. 8 may be used as the memory device shown in FIG. 1 or be used as the memory device shown in FIG. 2. The two-dimensional memory cell array 250 of the memory device 200 shown in FIG. 8 may include the cross-point array and the memory cells MC that are described with reference to FIGS. 3A and 3B.

Referring to FIG. 8, the memory device 200 may include first conductive lines La1 to La6 and second conductive lines Lb1 to Lb6 that extend in directions intersecting each other. The memory cells MC may be disposed at intersection portions of the first conductive lines La1 to La6 and the second conductive lines Lb1 to Lb6. In an embodiment, the first conductive lines La1 to La6 may be used as word lines, and the second conductive lines Lb1 to Lb6 may be used as bit lines. In another embodiment, the first conductive lines La1 to La6 may be used as bit lines, and the second conductive lines Lb1 to Lb6 may be used as word lines.

The first conductive lines La1 to La6 may extend in a first direction I, and be spaced apart from each other in a second direction II intersecting the first direction I. The second conductive lines Lb1 to Lb6 may extend in the second direction II, and be spaced apart from each other in the first direction I.

The first conductive lines La1 to La6 may be connected to a first selector 211, and the second conductive lines Lb1 to Lb6 may be connected to a second selector 213. One of the first selector 211 and the second selector 213 may be the row selector 41 described with reference to FIG. 2, and the other of the first selector 211 and the second selector 213 may be the column selector 43 described with reference to FIG. 2. At least one of the first selector 211 and the second selector 213 may include selection circuits similar to the first and second selection circuits C1 and C2 described with reference to FIG. 5.

In an embodiment, the first selector 211 may include first selection transistors NA respectively connected to the first conductive lines La1 to La6 and first discharge circuits DISA. Each of the first discharge circuits DISA may be configured to discharge two or more first conductive lines in response to a gate control signal corresponding thereto. For example, the first conductive lines La1 to La6 may be divided into a plurality of pairs, and the first selection transistors NA may be divided into a plurality of pairs respectively corresponding to the plurality of pairs of the first conductive lines La1 to La6.

Each of the first discharge circuits DISA may be configured to discharge a pair of first conductive lines corresponding thereto among the first conductive lines La1 to La6 in response to a gate control signal corresponding thereto. To this end, each of the first discharge circuits DISA may include a first discharge transistor PA1 and a second discharge transistor PA2 that are connected in series between a pair of first conductive lines corresponding thereto. The first discharge transistor PA1 and the second discharge transistor PA2 may be also connected to a pair of first selection transistors corresponding thereto among the first selection transistors NA. The first discharge transistor PA1 and the second discharge transistor PA2 may share a gate with each other and share a source with each other.

In an embodiment, the second selector 213 may include second selection transistors NB respectively connected to the second conductive lines Lb1 to Lb6 and second discharge circuits DISB. Each of the second discharge circuits DISB may be configured to discharge two or more second conductive lines in response to a gate control signal corresponding thereto. For example, the second conductive lines Lb1 to Lb6 may be divided into a plurality of pairs, and the second selection transistors NB may be divided into a plurality of pairs respectively corresponding to the plurality of pairs of the second conductive lines Lb1 to Lb6.

Each of the second discharge circuits DISB may be configured to discharge a pair of second conductive lines corresponding thereto among the second conductive lines Lb1 to Lb6 in response to a gate control signal corresponding thereto. To this end, each of the second discharge circuits DISB may include a third discharge transistor PB1 and a fourth discharge transistor PB2 that are connected in series between a pair of second conductive lines corresponding thereto. The third discharge transistor PB1 and the fourth discharge transistor PB2 may be also connected to a pair of second selection transistors corresponding thereto among the second selection transistors NB. The third discharge transistor PB1 and the fourth discharge transistor PB2 may share a gate with each other and share a source with each other.

Selection operations of the first conductive lines La1 to La6 may be controlled by turning on or off the first selection transistors NA, and selection operations of the second conductive lines Lb1 to Lb6 may be controlled by turning on or off the second selection transistors NB.

Figure 9:
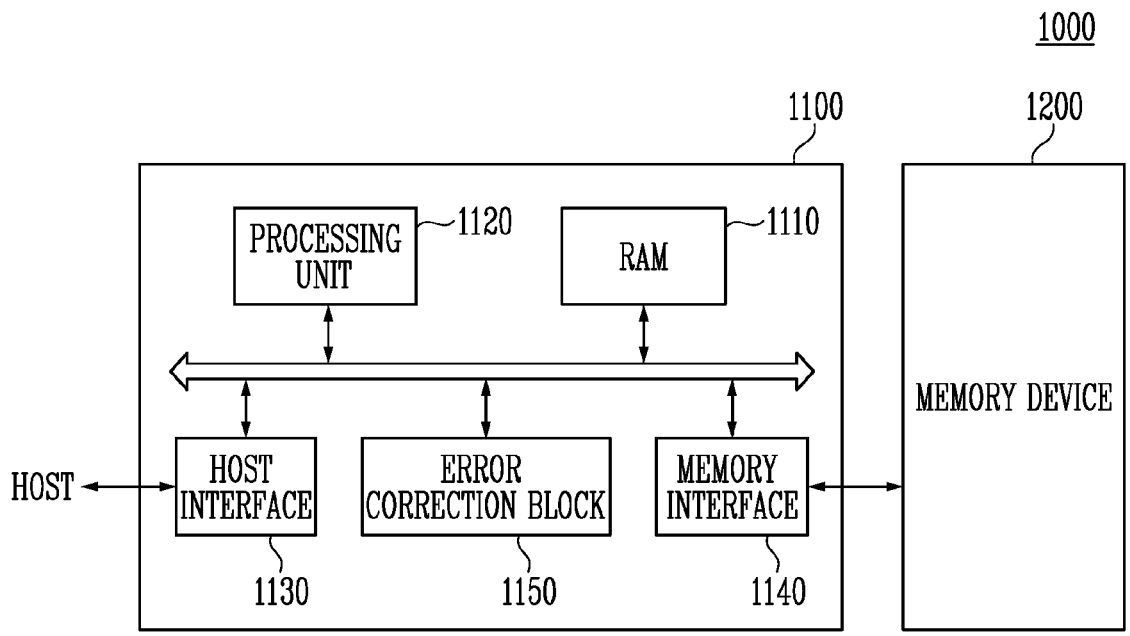
FIGS. 9 and 10 are block diagrams illustrating memory systems in accordance with various embodiments of the present disclosure.
Figure 10:
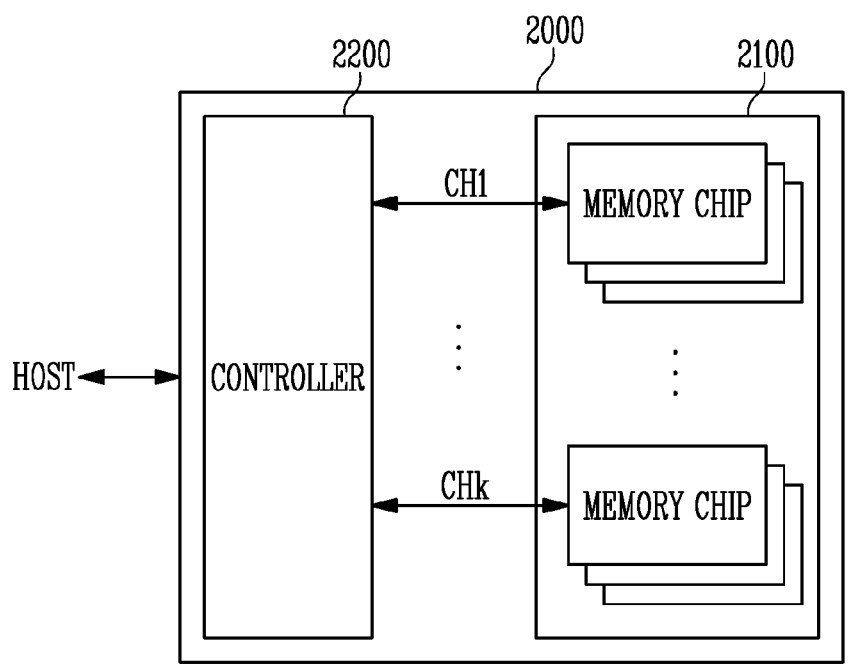

FIGS. 9 and 10 are block diagrams illustrating memory systems in accordance with various embodiments of the present disclosure.

Referring to FIG. 9, a memory system 1000 includes a memory device 1200 and a controller 1100.

The memory device 1200 may include a discharge circuit configured to control discharge operations of two or more conductive lines included in a memory cell array in response to a single gate control signal.

The controller 1100 is connected to a host and the memory device 1200. The controller 1100 accesses the memory device 1200 in response to a request from the host. For example, the controller 1100 controls a read operation, a write operation, and a background operation of the memory device 1200.

The controller 1100 provides an interface between the memory device 1200 and the host. The controller 1100 drives firmware for controlling the memory device 1200.

The controller 1100 includes a random access memory (RAM) 1110, a processing unit 1120, a host interface 1130, a memory interface 1140, and an error correction block 1150.

The RAM 1110 is used as at least one of a working memory of the processing unit 1120, a cache memory between the memory device 1200 and the host, and a buffer memory between the memory device 1200 and the host. The processing unit 1120 controls overall operations of the controller 1100. In addition, the controller 1100 may temporarily store program data provided from the host in a program operation.

The host interface 1130 includes a protocol for performing data exchange between the host and the controller 1100. The protocol may be one of various protocols such as a Peripheral Component Interconnect (PCI) protocol, a Peripheral Component Interconnect-Express (PCI-E) protocol, an Advanced Technology Attachment (ATA) protocol, a Serial ATA (SATA) protocol, a Parallel ATA (PATA) protocol, a Small Computer Small Interface (SCSI) protocol, a serial Attached SCSI (SAS) protocol, a Universal Serial Bus (USB) protocol, a Multi-Media Card (MMC) protocol, an Enhanced Small Disk Interface (ESDI) protocol, and an Integrated Drive Electronics (IDE) protocol.

The memory interface 1140 interfaces with the memory device 1200. In an embodiment, the memory interface 1140 may include a NAND interface or a NOR interface.

The error correction block 1150 detects and corrects an error of data received from the memory device 1200 by using an error correction code (ECC). The processing unit 1120 may control the memory device 1200 to adjust a read voltage based on an error detection result of the error correction block 1150, and to perform a read operation using the adjusted read voltage. In an exemplary embodiment, the error correction block 1150 may be provided as a component of the controller 1100.

The controller 1100 and the memory device 1200 may be integrated as one semiconductor device. In an exemplary embodiment, the controller 1100 and the memory device 1200 may be integrated as one semiconductor device to constitute a memory card such as a PC card (Personal Computer Memory Card International Association (PCM-CIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the memory device 1200 may be integrated into one semiconductor device to constitute a semiconductor drive such as a solid state drive (SSD). The SSD includes a storage device configured to store data in a semiconductor memory. If the memory system 1000 is used as the SSD, the operating speed of the host connected to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1200 or the memory system 1000 may be packaged in one of various forms. For example, the memory device 1200 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in wafer form, Chip On Board (COB), Ceramic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Referring to FIG. 10, a memory system 2000 includes a memory device 2100 and a controller 2200. The memory device 2100 includes a plurality of memory chips. The plurality of memory chips are divided into a plurality of groups.

The plurality of groups may communicate with the controller 2200 through first to kth channels CH1 to CHk, k being a positive integer. Each of the plurality of memory chips may be configured and operate identically to the memory device 1200 described with reference to FIG. 9.

Each of the plurality of groups communicates with the controller 2200 through one common channel. The controller 2200 is configured identically to the controller 1100 described with reference to FIG. 9. The controller 2200 controls the plurality of memory chips of the memory device 2100 through the plurality of channels CH1 to CHk.

Figure 11:
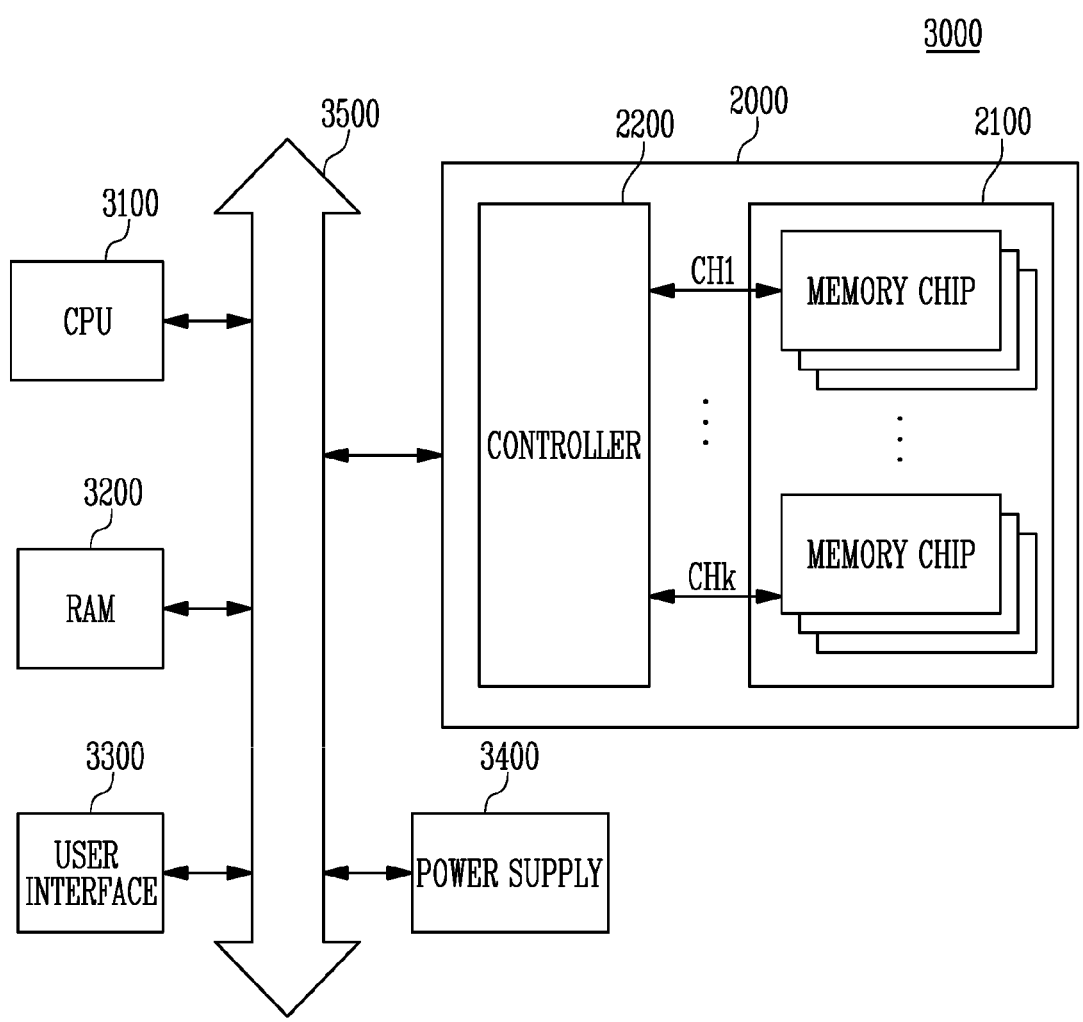
FIG. 11 is a block diagram illustrating a computing system in accordance with an embodiment of the present disclosure.

FIG. 11 is a block diagram illustrating a computing system 3000 in accordance with an embodiment of the present disclosure.

Referring to FIG. 11, the computing system 3000 includes a central processing unit 3100, a RAM 3200, a user interface 3300, a power supply 3400, a system bus 3500, and a memory system 2000.

The memory system 2000 is electrically connected to the central processing unit 3100, the RAM 3200, the user interface 3300, and the power supply 3400 through the system bus 3500. Data supplied through the user interface 3300 or data processed by the central processing unit 3100 are stored in the memory system 2000.

A memory device 2100 is connected to the system bus 3500 through a controller 2200. Alternatively, the memory device 2100 may be directly connected to the system bus 3500. The function of the controller 2200 may be performed by the central processing unit 3100 and the RAM 3200.

FIG. 11 illustrates the computing system 3000 including the memory system 2000 described with reference to FIG. 10. However, embodiments of the present disclosure are not limited thereto. For example, the memory system 2000 of the computing system 3000 may be replaced with the memory system 1000 described with reference to FIG. 9. In an exemplary embodiment, the computing system 3000 may include both the memory systems 1000 and 2000 described with reference to FIGS. 9 and 10, respectively.

In accordance with the present disclosure, a memory device includes a discharge circuit configured to commonly discharge two or more conductive lines that can be individually selected by different selection transistors. Accordingly, an area occupied by a peripheral circuit of the memory device can be reduced. Accordingly, a chip size of the memory device can be reduced.

While various embodiments have been described above, it will be understood to those skilled in the art that the embodiments described are by way of example only. Accordingly, the system and device described herein should not be limited based on the described embodiments.

What is claimed is:

1. A memory device, comprising:
a first deck including a first memory cell connected to a first deck-first conductive line;
a second deck disposed over the first deck, the second deck including a second memory cell connected to a second deck-first conductive line;
a third deck disposed over the second deck, the third deck including a third memory cell connected to a third deck-first conductive line;
a fourth deck disposed over the third deck, the fourth deck including a fourth memory cell connected to a fourth deck-first conductive line;
a first selection circuit including a first discharge circuit and first and second selection transistors respectively connected to the first deck-first conductive line and the third deck-first conductive line, the first discharge circuit commonly connected to the first and second selection transistors; and
a second selection circuit including a second discharge circuit and third and fourth selection transistors respectively connected to the second deck-first conductive line and the fourth deck-first conductive line, the second discharge circuit commonly connected to the third and fourth selection transistors.

2. The memory device of claim 1, wherein the first discharge circuit includes a first discharge transistor and a second discharge transistor that share a gate with each other and share a source with each other, and
the second discharge circuit includes a third discharge transistor and a fourth discharge transistor that share a gate with each other and share a source with each other.

3. The memory device of claim 2, wherein a drain of the first discharge transistor is connected to a drain of the first selection transistor,
a drain of the second discharge transistor is connected to a drain of the second selection transistor,
a drain of the third discharge transistor is connected to a drain of the third selection transistor, and
a drain of the fourth discharge transistor is connected to a drain of the fourth selection transistor.

4. The memory device of claim 3, wherein the first deck-first conductive line is connected to a connection node of the first discharge transistor and the first selection transistor,
the third deck-first conductive line is connected to a connection node of the second discharge transistor and the second selection transistor,
the second deck-first conductive line is connected to a connection node of the third discharge transistor and the third selection transistor, and
the fourth deck-first conductive line is connected to a connection node of the fourth discharge transistor and the fourth selection transistor.

5. The memory device of claim 1, further comprising:
a lower second conductive line commonly connected to the first memory cell and the second memory cell, the lower second conductive line extending in a direction intersecting the first to fourth deck-first conductive lines; and
an upper second conductive line commonly connected to the third memory cell and the fourth memory cell, the upper second conductive line extending in the direction intersecting the first to fourth deck-first conductive lines.

6. The memory device of claim 5, wherein the lower second conductive line and the upper second conductive line are connected to each other.

7. A memory device, comprising:
a first deck including a first memory cell connected to a first deck-first conductive line extending in a first direction and a lower second conductive line extending in a second direction intersecting the first direction;
a second deck disposed over the first deck, the second deck including a second memory cell connected to the lower second conductive line and a second deck-first conductive line extending in the first direction;
a third deck disposed over the second deck, the third deck including a third memory cell connected to a third deck-first conductive line extending in the first direction and an upper second conductive line extending in the second direction;
a fourth deck disposed over the third deck, the fourth deck including a fourth memory cell connected to the upper second conductive line and a fourth deck-first conductive line extending in the first direction;
a first selection circuit configured to commonly control a discharge operation of the first deck-first conductive line and a discharge operation of the third deck-first conductive line, and individually control a selection operation of the first deck-first conductive line and a selection operation of the third deck-first conductive line; and
a second selection circuit configured to commonly control a discharge operation of the second deck-first conductive line and a discharge operation of the fourth deck-first conductive line, and individually control a selection operation of the second deck-first conductive line and a selection operation of the fourth deck-first conductive line.

8. The memory device of claim 7, wherein the first selection circuit includes a first selection transistor connected to the first deck-first conductive line, a second selection transistor connected to the third deck-first conductive line, and a first discharge circuit connected between the first selection transistor and the second selection transistor, the first discharge circuit commonly discharging the first deck-first conductive line and the third deck-first conductive line, and the second selection circuit includes a third selection transistor connected to the second deck-first conductive line, a fourth selection transistor connected to the fourth deck-first conductive line, and a second discharge circuit connected between the third selection transistor and the fourth selection transistor, the second discharge circuit commonly discharging the second deck-first conductive line and the fourth deck-first conductive line.

9. The memory device of claim 8, wherein the first discharge circuit includes a first discharge transistor and a second discharge transistor that share a gate with each other and share a source with each other, and the second discharge circuit includes a third discharge transistor and a fourth discharge transistor that share a gate with each other and share a source with each other.

10. The memory device of claim 9, wherein a drain of the first selection transistor, a drain of the first discharge transistor, and the first deck-first conductive line are connected to each other, a drain of the second selection transistor, a drain of the second discharge transistor, and the third deck-first conductive line are connected to each other, a drain of the third selection transistor, a drain of the third discharge transistor, and the second deck-first conductive line are connected to each other, and a drain of the fourth selection transistor, a drain of the fourth discharge transistor, and the fourth deck-first conductive line are connected to each other.

11. The memory device of claim 7, wherein the lower second conductive line and the upper second conductive line are connected to each other.

12. A memory device, comprising:
first conductive lines extending in a first direction;
second conductive lines extending in a second direction intersecting the first direction;
a plurality of memory cells disposed at intersection portions of the first conductive lines and the second conductive lines;
first selection transistors respectively connected to the first conductive lines, the first selection transistors constituting a plurality of groups; and
first discharge circuits respectively connected to the plurality of groups of first selection transistors, each of the first discharge circuits discharging a group of first conductive lines corresponding thereto among the first conductive lines in response to a gate control signal,
wherein each of the plurality of groups of first selection transistors includes two or more of the first selection transistors.

13. The memory device of claim 12, wherein each of the first discharge circuits includes two or more discharge transistors, wherein the two or more discharge transistors share a gate with each other, share a source with each other, are connected to different first conductive lines, and are connected to different first selection transistors.

14. The memory device of claim 12, wherein the first conductive lines are stacked in a third direction perpendicularly intersecting a plane extending in the first direction and the second direction, and wherein the second conductive lines are disposed between first conductive lines adjacent to each other in the third direction, and are connected to each other.

15. The memory device of claim 12, wherein the first conductive lines are arranged in the second direction, and wherein the second conductive lines are arranged in the first direction.

16. The memory device of claim 15, further comprising:
second selection transistors respectively connected to the second conductive lines, the second selection transistors constituting a plurality of groups; and
second discharge circuits respectively connected to the plurality of groups of second selection transistors, the second discharge circuits each discharging a group of second conductive lines corresponding thereto among the second conductive lines in response to a gate control signal,
wherein each of the plurality of groups of second selection transistors includes two or more of the second selection transistors.

17. The memory device of claim 16, wherein each of the second discharge circuits includes two or more discharge transistors, wherein the two or more discharge transistors share a gate with each other, share a source with each other, are connected to different second conductive lines, and are connected to different second selection transistors.

* * * * *